United States Patent [19]

Economikos et al.

[11] Patent Number: 5,384,953
[45] Date of Patent: Jan. 31, 1995

[54] STRUCTURE AND A METHOD FOR REPAIRING ELECTRICAL LINES

[75] Inventors: Laertis Economikos, Wappingers Falls; Richard P. Surprenant, Red Hook, both of N.Y.

[73] Assignee: International Business Machines Corporation, Armonk, N.Y.

[21] Appl. No.: 94,633

[22] Filed: Jul. 21, 1993

[51] Int. Cl.[6] ............................................. H05K 3/02
[52] U.S. Cl. .................... 29/846; 29/402.01; 29/402.18; 228/180.21; 427/96
[58] Field of Search ............... 427/96, 98; 228/180.21; 29/846, 402.18

[56] References Cited

U.S. PATENT DOCUMENTS

| | | | |
|---|---|---|---|
| 4,258,078 | 3/1981 | Celler et al. | 427/96 X |
| 4,259,367 | 3/1981 | Dougherty, Jr. | |
| 4,403,410 | 9/1983 | Robinson | 228/180.21 X |
| 4,418,264 | 11/1983 | Thorwarth | |
| 4,572,941 | 2/1986 | Sciaky et al. | |
| 4,615,765 | 10/1986 | Levinson et al. | |
| 4,630,355 | 12/1986 | Johnson | |
| 4,704,304 | 11/1987 | Amendola et al. | |
| 4,714,684 | 12/1987 | Sugahara et al. | |
| 4,756,927 | 7/1988 | Black et al. | |
| 4,877,481 | 10/1989 | Fukuda et al. | |
| 4,880,959 | 11/1989 | Baum et al. | |
| 4,882,200 | 11/1989 | Liu et al. | |
| 4,906,491 | 3/1990 | Yamazaki | |
| 4,908,938 | 3/1990 | Thorwarth et al. | 29/846 |
| 4,919,971 | 4/1990 | Chen | |
| 5,064,681 | 11/1991 | Berry et al. | |
| 5,091,218 | 2/1992 | Altman et al. | |
| 5,130,172 | 7/1992 | Hicks et al. | |
| 5,145,714 | 9/1992 | Reisman et al. | |
| 5,153,408 | 10/1992 | Handford et al. | |
| 5,182,230 | 1/1993 | Donelon et al. | |
| 5,193,732 | 3/1993 | Interrante et al. | |

OTHER PUBLICATIONS

IBM Tech Disclosure Bull vol. 9 No. 10, Mar. 1967 p. 1369 by Feulner.
IBM Technical Disclosure Bulletin (Gobran), vol. 27, No. 5, p. 3041 (Oct. 1984), entitled "Tailless Thermo-Compression Bonding".
IBM Technical Disclosure Bulletin (Anderson, et al.), vol. 26, No. 12, pp. 6244–6245 (May 1984), entitled "Josephson Package Repair".
IBM Technical Disclosure Bulletin (Bakos, et al.), vol. 22, No. 9, pp. 3986–3987 (Feb. 1980), entitled "Circuit Repair/Work of Metallized Polyimide Substrates".
IBM Technical Disclosure Bulletin (Mackey, et al.), vol. 15, No. 8, p. 2423 (Jan. 1973), entitled "Conductive Line Jumper/Repair Connection in Glass Metal Module".
IBM Technical Disclosure Bulletin (Tappen), vol. 14, No. 10, p. 2915 (Mar. 1972), entitled "Open Conductor Repair for Glass Metal Module".
IBM Technical Disclosure Bulletin (Mutnick), vol. 8, No. 11, p. 1469 (Apr. 1966), entitled "Repairing Breaks in Printed Circuits".

*Primary Examiner*—Carl J. Arbes
*Attorney, Agent, or Firm*—Aziz M. Ahsan

[57] ABSTRACT

The present invention relates generally to a new structure and a method for repairing electrical lines, and more particularly, the invention encompasses a structure and a method for repairing electrical lines on a ceramic or a semiconductor substrate. On a substrate that has an open or an electrical discontinuity, one or more trenches or grooves are made next to the open, or discontinuity and using standard deposition process one or more metals are deposited in the open to provide or restore electrical continuity while the excess deposition material is allowed to drain or propagate into the trench.

19 Claims, 2 Drawing Sheets

STRUCTURE AND A METHOD FOR REPAIRING ELECTRICAL LINES

FIELD OF THE INVENTION

The present invention relates generally to a new structure and a method for repairing electrical lines, and more particularly, the invention encompasses a structure and a method for repairing electrical lines on a ceramic or a semiconductor substrate.

BACKGROUND OF THE INVENTION

With the advent of modern day electronics, the circuits on a PCB (Printed Circuit Board) or ceramic modules or chips have become more and more dense. As a result the electrical lines or conductor lines are thinner and narrower so that more of them can be placed in a given area. Therefore, the probability of the conductor lines having defects increases and each of the electronic line carriers has to be inspected for faults in the conductor lines. This inspection can be done visually (manually) or automatically, or the lines can also be electrically verified. Once a fault or defect is found, then it has to be located and repaired. Most of the methods presently under use require that the fault or defect be visually located by the operator, and then the defective conductor line is repaired.

The testing and repairing of the conductor lines are among the most critical steps in the packaging technology. This is because the electronic hardware must be reliable and free from defects, as they are very expensive to manufacture and the field failures cannot be repaired easily. To eliminate these immediate and potential defects, tremendous efforts are being made.

The most commonly found defects are opens, or cracks in lines, or shorts between lines. Most defects or faults in a conductor line are due to masking or improper deposition of the conductive material. But they could also be related to other factors, such as impure material or stretching the resolution limits of the lithography process. The thin film redistribution lines may have opens due to contamination, process mishaps and physical damage.

Another reason for opens is due to stresses generated during thermal cycles in the bond and test process used during assembly of PCB or ceramic modules. The thin film lines with cracks and other latent defects may also develop opens. These opens must be repaired in order to use the substrate or module or package which is otherwise electrically good.

Particularly, in the thin film processing, the thin film redistribution and other interconnection lines are susceptible to defects which could result in the lines being electrically open. Defects could include voids, missing metal, various particle contamination or physical damage. A redundant metal scheme helps to substantially reduce the number of defective lines, but this scheme does not eliminate them entirely. Those lines identified as "open" after thin film electrical test can be repaired by processes such as laser CVD (Chemical Vapor Deposition) prior to a polyimide overcoat process. Occasionally a line becomes "open" during subsequent thermal processing. These defective conductors appear in the module or substrate, after pins, capacitors and chips are joined. If an "open" line should be found at this point, it is essential to repair the defect so that the module or the substrate or the package can be used.

It is disclosed in, "Repairing Breaks in Printed Circuits," IBM Technical Disclosure Bulletin, Vol. 8, No. 11, Page 1469 (April, 1966), that small breaks in a line can be repaired by filling the gap in the broken line with a material that is cured at room temperature or higher to form a base conductive material. A conductive metal layer is then electroplated over the base conductive material to complete the repair. Using this process would require that lines to be repaired, on extremely dense packages with chips, capacitors and discrete wires in place, be isolated during electroplating. This would create significant handling and tooling problem.

"Open Conductor Repair For Glass Metal Module," IBM Technical Disclosure Bulletin, Vol. 14, No. 10, Page 2915 (March, 1972), discloses another method of making open repairs. Here a metal line to be transferred is aligned over the open or break, and using a laser beam, a portion of the metal layer is welded to each end of the broken line. This article also teaches that the line could be reflowed into the break using a laser or it could be evaporated into the break. Each of these features cannot be used with the present invention, because melting of high temperature conductive metals, such as copper, is used. Energy required to melt such lines by laser would damage polyimide adjacent to the lines to be repaired.

A rather complex process for repairs of opens is disclosed in U.S. Pat. No. 4,259,367 (Dougherty, Jr.), where a conductor patch line is interconnected onto a good line through an insulating layer. This requires the addition of new wiring layers with photolithographic techniques which would be incompatible with a substrate with components already in place.

Another method of repairing opens is by decal transfer as disclosed in U.S. Pat. No. 4,704,304 (Amendola, et al.), and presently assigned to IBM Corporation.

Still another method of electric circuit line repairs is taught in U.S. Pat. No. 4,630,355 (Johnson). A layer of phase-change material is deposited prior to the deposition of the conductive line and in case an open results in the conductive line, a current is passed so that a portion of the phase-change material becomes electrically conductive and makes an electrical bridge across the gap or open. This method is not suitable for repairs on polyimide films due to lack of adhesion of such phase-change materials to polyimide.

In U.S. Pat. No. 4,418,264 (Thorwarth), a specifically shaped metallic part is placed on the conductor path interruption and by means of microresistance welding, the metallic part is welded to the conductor to bridge the interruption. Welding involves melting of the repair material which when used on current "state of the art" thin film polymer packages could cause structural damage to the polymer. Welding also requires the passage of drive currents which would be incompatible with this invention as there may be active devices which are connected to the lines being repaired at different locations.

Another method of repairing opens and narrow necks has been disclosed in U.S. Pat. No. 4,919,971 (Chen). The defective site in the conductor line having a thin portion or a narrow neck does not have to be physically located to initiate the repairs. The process of this invention is self-induced, i.e., the passage of the drive current creates a hot spot at the defective site and conductive material is induced to be deposited at the defective site. The process of this invention is also self-limiting, i.e., when the defect has been repaired, the process will slow down and stop by itself. This technique requires the substrate to be immersed in a plating bath or be exposed to organometallic vapors which would make it incompatible with line repair processes where the active and passive components have already been mounted on a substrate.

"Conductive Line Jumper/Repair Connection in Glass Metal Module," IBM Technical Disclosure Bulletin, Vol 15, No. 8, Page 2423 (January, 1973), discloses another method of making open repairs. Here after the open has been located, a wire is placed across the open line and the wire is welded to each end of the open line. After welding, the repaired plane is glassed over leaving a surface suitable for developing another circuit layer. This process teaches the repairs of the carrier at the build level, and not at the functional module level. This process also requires the use of high melting point metals and a subsequent sintering of inorganic materials.

Another welding process for repairing of opens is discussed in, "Circuit Repair/Work of Metallized Polyimide Substrates," IBM Technical Disclosure Bulletin, Vol. 22, No. 9, Page 3986 (February, 1980). A piece of wire is jumpered across the open and both ends of the jumpered wire are welded to the circuit line, thus yielding a "continuous electrical line." This process also discloses the use of high melting point metals.

Another method of making circuit repairs is disclosed in, "Tailless Thermo-Compression Bonding," IBM Technical Disclosure Bulletin, Vol. 27, No. 5, Page 3041 (October, 1984), where the circuit line is repaired by passing an electric current between two electrodes which fuse the circuit line and the repair material together.

"Josephson Package Repair," IBM Technical Disclosure Bulletin, Vol. 26, No. 12, Pages 6244–6245 (May, 1984), is another example of making repairs. The faulty circuits are cut out by laser scribing, and the repair of an open is done by cutting the bad line next to the pad and using a third wiring level to reconnect to the proper pads. This process has the limitation of requiring photolithographic techniques to form the new wiring level. Furthermore, additional thin film process steps cannot be done after chips, pins etc, have been attached.

Laser deposition methods are also being developed for repairing circuit opens. As disclosed in U.S. patent application Ser. No. 223,487, filed on July 25, 1988, now U.S. Pat. No. 5,182,230, and presently assigned to IBM Corporation, an open circuit is repaired by laser induced electroplating process based on the thermobattery effect. One tip of the open conductor is heated with a laser beam, and a thermobattery is formed between the hot spot (tip of the conductor) and the cold part (normal section of the conductor). The laser heating of the tip induces the conductive material present in the plating solution to be formed at the hot tip. This process is continued until the growth of the conductive material joins the two open ends of the open, and a continuous electrical path is formed.

Another process for interconnecting thin-film electrical circuits is taught in U.S. Pat. No. 4,880,959, and presently assigned to IBM Corporation. Both ends of the existing circuit are partially ablated at the open defect site with pulses from an excimer laser, and then gold metal is deposited by LCVD (laser chemical vapor deposition). This process makes the repairs right after the thin film deposition, and prior to any subsequent module build (i.e. at the substrate level).

Under some circumstances a laser, as disclosed in U.S. Pat. No. 4,572,941 (Sciaky, et al.), could be used to make spot welds. The laser induced melting can cause structural damage to sensitive dielectrics and adjoining lines.

Thin film metallurgical lines are often applied or deposited onto a dielectric material which acts as a carrier or substrate for the deposited features. The sole purpose of this carrier may be the physical support of the thin film features as is the case of most dielectric polymers. The carrier may also serve as part of the over-all electrical package in which thin film lines are deposited directly onto a single or multilayered ceramic substrate.

The thickness, width and pitch of a thin film line is dependant upon the desired electrical properties of the package. Often a single thin film line will vary in shape, width and proximity to adjacent features along its total path. As a result, process defects may result in opens across these thin film lines, as discussed earlier, at a point where the geometry of the line and the distance to the nearest feature could be very close. Again, the distance to the nearest feature vary widely from line to line.

The use of Laser Chemical Vapor Deposition (LCVD) to repair opens on thin film lines requires that process parameters be established which take into account heat transfer at the repair site.

Typically, when electrically conductive material or metal, such as, gold, copper, etc, is deposited to bridge the open on a thin film line it leads to excess metal deposition on adjacent features if the distance between features is very close, say for example, less than 50 microns. In addition, once the bridging is formed, laser energy starts to dissipate away from the line to be repaired and starts entering the adjacent lines that got connected. The latter yields poor deposition on the repair site.

The process of this invention guards against both situations. Basically, the location to be repaired is located by methods well known in the art. After the open or location to be repaired has been site dressed, at least one blind hole or groove is formed in the material surrounding the open, typically, using an excimer laser. For best results two grooves or trenches or blind holes should be formed on the left and right side of the open or location to be repaired. These grooves solve the two problems described above by directing more of the laser energy along the path of the defective line. As a result, more electrically conductive metal, such as, copper or gold, is deposited across defect in the line, leading to more reliable repairs. By directing the heat along the thin film line being repaired, less heat is allowed to migrate towards other features, thus eliminating the possibility of inadvertent shorting.

SUMMARY AND PURPOSES OF THE INVENTION

The invention is a novel method and an apparatus for providing a reliable repair for an open in a semiconductor item.

Therefore, one purpose of this invention is to provide an apparatus and a method that will provide a reliable repair for an open in a semiconductor item.

Another purpose of this invention is to provide at least one trench adjacent to an open or an area to be repaired.

Still another purpose of this invention is to provide at least one slug that will provide electrical continuity to a thin film line while a portion of the slug is in a trench adjacent the open.

Yet another purpose of this invention is to eliminate shorting of adjacent lines during line repair.

In one aspect this invention comprises a method for repairing electrical lines on a substrate comprising the following steps:

a. locating said electrical line that needs to be repaired, and site dressing said location, b. forming at least one trench on said substrate adjacent to said site dressed location such that at least a portion of said at least one trench is close to at least a portion of said site dressed location and said electrical line, c. depositing electrically conductive material in said site dressed location to restore electrical continuity to said electrical line while allowing an excess portion of said deposited material to flow into at least a portion of said at least one trench.

In another aspect this invention comprises a repaired structure comprising a carrier having at least one electrical line, wherein at least a portion of said electrical line has a slug that provides electrical continuity to said electrical line and wherein said slug is formed subsequent to the formation of said electrical line, and at least one trench adjacent to at least a portion of said slug to accommodate any overflow material from said slug.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1A:
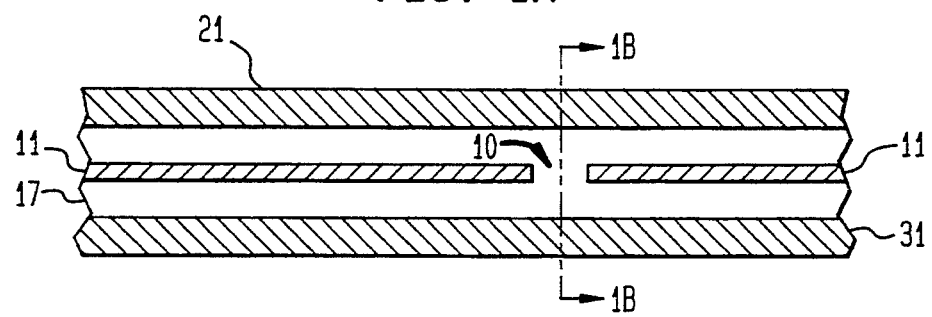
FIG. 1A, illustrates a top view of an open on a ceramic substrate.

This invention describes various methods of repairing opens and near opens and latent defects in electrical conductor lines.

Latent defects include narrow neck or thin portion or other contamination related defects. The term latent defects, as Used herein, also means a small portion or section of a conductor line which has a higher resistance per unit length than the normal conductor line. The narrow neck can be of a different shape, for example, the narrow neck could be a local reduction in the line width or a local reduction of line height or thickness or a portion of the line may be made of a material with lower conductivity than that of a normal line. The narrow neck could also include a thin electrical connection or a bridge across an open circuit, or a crack which before stressing does not show up as an open.

An open as understood in the art, is any missing conductor across which current cannot flow or is significantly impeded. This typically establishes a resistance threshold above which the electrical conductive path is considered open.

Thin film is a term currently used by the industry to define lines that are formed on a substrate or a carrier that have a very small dimensions (of the order of a few micrometers). Thin films are so small that they can only be clearly seen using a microscope or similar such device. Therefore, the repairs of such conductive lines with such dimensions is equally difficult.

The method as disclosed by this invention is performed at relatively low temperatures, therefore, this method can be used on substrates with metal/polymer thin film wiring, or other organic materials. It can also be applied to printed circuit boards.

In most cases the protective coating is a polyimide layer or some other dielectric or insulator layer. Typically, the material for the electrically conductive metal or material for the thin film line or for the nugget or repair segment is selected from a group comprising aluminum, antimony, bismuth, chromium, cobalt, copper, gold, indium, iron, lead, molybdenum, nickel, palladium, platinum, silver, tantalum, tin, titanium, tungsten, or alloys thereof.

In each case where an open has been formed, at least a portion of the conductor line must be exposed and prepared by appropriate methods to allow subsequent repair. This is known as site-dressing. In some situations more than one portion of the electrical line will have to be exposed and prepared. In most situations, only a portion of the electrical line that will be used in the repair process needs to be exposed and site-dressed. During the site-dressing process it is preferred that at least a portion of the upper surface of the wire or the electrical line that is to be repaired is laser ablated, this is done for a number of reasons, such as to clean the upper surface of the electrical line.

Interconnection or repair of thin film circuits can be difficult to make in some instances. For example, the metallurgy in an existing circuit may consist of multiple layers, where the top most layer is a barrier metal, e.g. chromium, that oxidizes and forms a protective, insulating layer. Similarly, the circuit line could have been overcoated with a dielectric material, thus preventing direct access to the site. Before a connection can be made in such circumstances, the protective layer(s) must be removed, and in such a way that a good mechanical and electrical contact can be made between the repair or interconnection metallurgy and the existing circuitry. In the operations required for repair using wire or solder, or combinations thereof, the removal process must also create a surface consistent with the additive process being used, either wettable by solder, or bondable by wire. The removal operation can be readily controlled by adjusting the fluence, wavelength and number of laser pulses or shots used, in order not to damage the conductor line.

In some cases the thin film beneath the polymer, such as polyimide, is a line, which has a metallurgical stack where the top layer is non-bondable to a metal unless a sub-layer is exposed which is more bondable. This sub-layer could be exposed using laser ablation. In this situation the top layer is typically Cr, and once the polyimide or similar insulator coating is removed, Cr gets oxidized, thus preventing the repair. In such circumstances the laser ablation could be used to remove the oxidized Cr layer and exposing a sub-layer, such as Cu, that can be used to carry out the line repair.

One such cleaning of bonding surfaces using a laser is disclosed in, "Laser Ablative Cleaning of Bonding Surfaces," IBM Technical Disclosure Bulletin, Vol 32, No. 4A, Pages 429–430 (September, 1989).

Figure 1B:
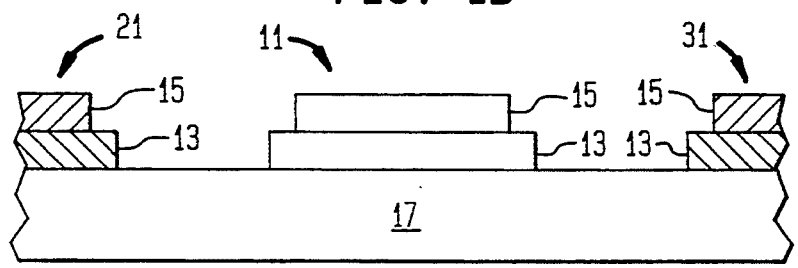
FIG. 1B, illustrate a cross-sectional view taken along 1B—1B, from FIG. 1A.

FIG. 1A, illustrates a top view of a typical open or discontinuity 10, in an electrical line 11, on a substrate 17, such as a ceramic or a semiconductor substrate. This open 10, could be due to a variety of reasons, such as a result of a manufacturing process defect or could be due to a deliberate attempt to fix an electrical connection. On a typical substrate 17, there are one or more electrical lines 11, 21 or 31. These lines 11, 21 or 31, could be a single level line or multi-level lines 13 and 15, as shown in FIG. 1B. Furthermore, FIG. 1B, illustrate a cross-sectional view taken along 1B—1B, from FIG. 1A, to clearly show two wiring levels 13 and 15. Of course, one could have a plurality of wiring levels similar to levels 13 and 15, and each of the levels could be made from the same material or different material. The material for wiring levels 13 or 15, is typically selected from a group comprising aluminum, antimony, bismuth, chromium, cobalt, copper, gold, indium, iron, lead, molybdenum, nickel, palladium, platinum, silver, tantalum, tin, titanium, tungsten, or alloys thereof. The substrate 17, could be single layer or a multilayer substrate, and the material for the substrate 17, could be selected from a group consisting of ceramic, glass ceramic, other insulative material, to name a few.

Figure 2A:
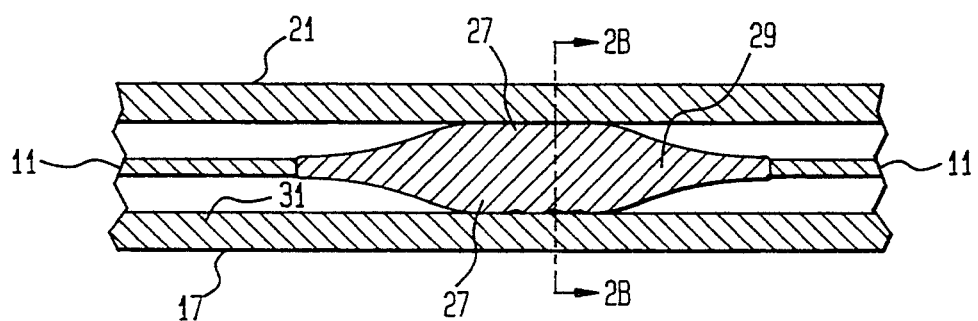
FIGS. 2A, 2B and 2C, illustrate one prior art process and structure of repairing the open of FIGS. 1A and 1B.
Figure 2B:
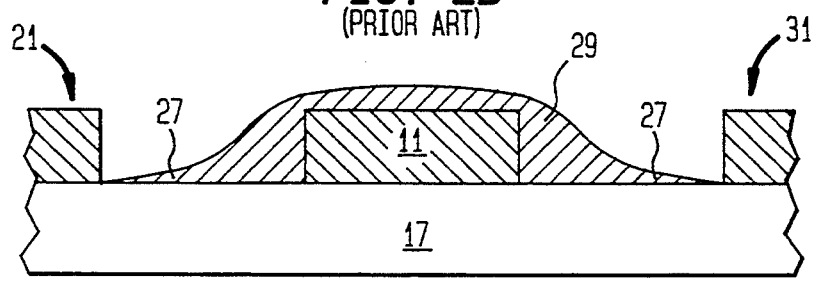
Figure 2C:
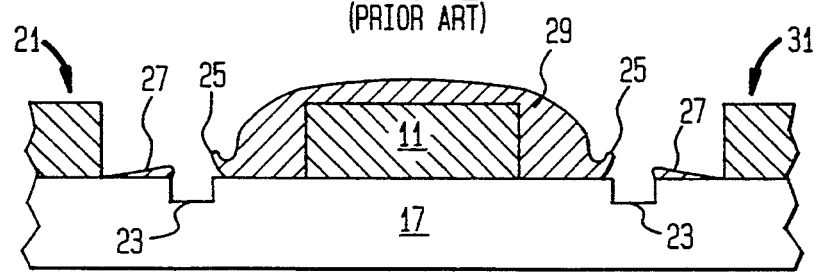

The problem of an open such as open 10, has been solved in a number of ways; see for example, U.S. Pat. Nos. 5,153,408, 5,193,732, assigned to International Business Machines Corporation, and the disclosure of which is incorporated herein by reference. One such method of the prior are is illustrated in FIGS. 2A, 2B and 2C, which is one prior art process and structure of repairing the open 10, of FIGS. 1A and 1B. After the open 10, has been site dressed by methods well known in the art, a gold layer 29, is typically deposited by CVD (Chemical Vapor Deposition) process as clearly shown in FIGS. 2A and 2B, where FIG. 2B, is the cross-sectional view taken along line 2B—2B, of FIG. 2A. During this CVD process the gold layer 29, that is being deposited between the two ends of the open not only connects or repairs the line 11, but also flows and comes in physical contact with the adjacent lines 11, 21 or 31, in region 27. The gold material 29, in region 27, has to be removed or at least a portion of the gold material 29, must be severed in order not to create an electrical short between the two adjacent electrical lines 21 or 31. FIG. 2C, shows one prior art method of creating a discontinuity in region 27, where a laser beam is applied across the region 27, and cutting through the gold layer 29, into the substrate 17, and thus creating a trench or separation region 23. This prior method has worked very well except that it creates gold flaps 25, that in some situations create problems during subsequent processing of the substrate. Additionally, during the laser cutting process of the gold layer 29, in region 27, the adjacent electrical lines are also in some cases adversely affected by the heat that is generated during the process of cutting through the gold 29. Moreover, the laser has to cut through the material 29, which is typically a metal, and more energy is needed. Furthermore, there is more metal material 29, on the line 11, that had an open 10, side than the adjacent electrical side 11, 21 or 31, and so one has to make sure that neither of the electrical lines 11, 21 or 31, are damaged or adversely affected due to this laser cutting process. These and other problems have been overcome as a result of this invention.

Figure 3A:
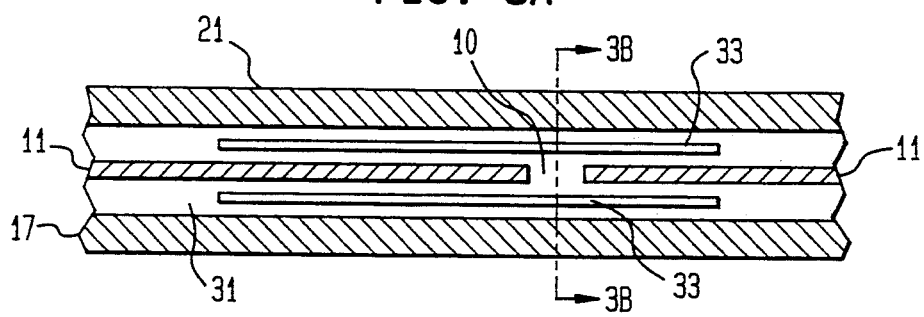
FIGS. 3A, 3B, 3C and 3D, illustrate process and structure of the preferred embodiment of repairing the open of FIGS. 1A and 1B.
Figure 3B:
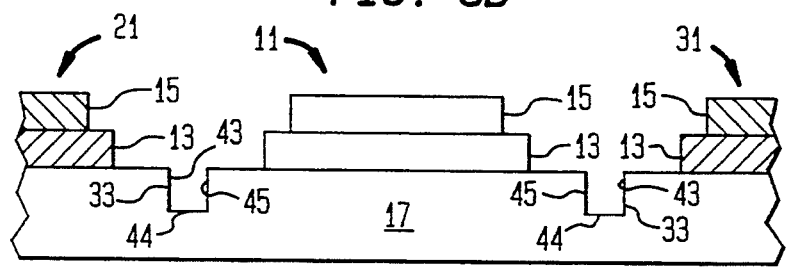
Figure 3C:
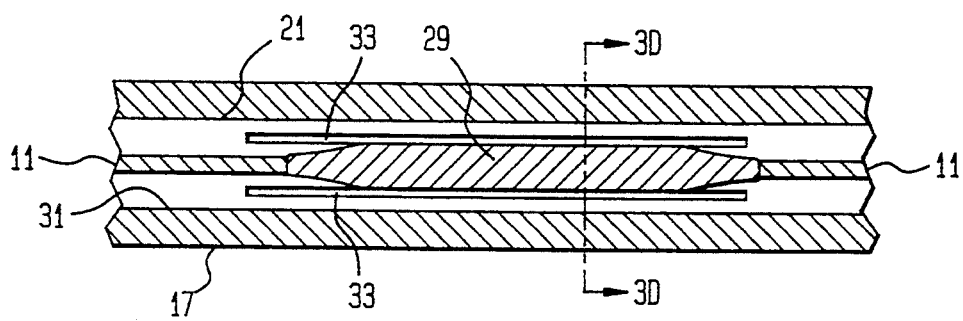

FIGS. 3A, 3B and 3C, illustrate process and structure of the preferred embodiment of repairing the open of FIGS. 1A and 1B. After the open 10, has been site dressed by methods well known in the art, a trench 33, is made along both sides of the open 10, as shown in FIGS. 3A and 3B, where FIG. 3B, is a cross-sectional view taken along line 3B—3B, in FIG. 3A. Of course one can have more than one trench 33, on either side of the open 10. The trench 33, should be between the two adjacent electrical lines 11 and 21 and/or 11 and 31, such that it does not have any adverse affect on either of the electrical lines 11, 21 or 31. Of course one can have more than one trench 33, on either side of the open 10. Furthermore, the trench 33, should be slightly longer than the length of the open 10, so as to fully serve its purpose to be discussed later. The trench 33, is made using methods well known in the art, such as laser ablation, ion milling, to name a few. The trench 33, is made on the substrate 17, which is typically an insulator type material, such as ceramic or glass ceramic, and this material is typically much more soft and easy to cut than the metal material used to make the line connections.

As more clearly illustrated in FIG. 3B, the trench 33, is cut into the substrate 17, adjacent to the open 10, and between the electrical lines 11 and 21 and/or 11 and 31. The trench 33, has a base 44, and two side walls 43 and 45. For the purposes of illustration only three electrical lines 11, 21 or 31, on the substrate or carrier 17, are shown. Of course one could have more electrical lines and other features on the carrier 17. The TSL (Top Surface Length) of the trench 33, should be such that it accommodates all of the material flowing into it, and further does not allow the material in it to contact the adjacent good lines. The TSL comprises of the base length 44, and the two side walls 43 and 45, of the trench 33. Therefore, it does not matter if the base 44, is wide or the depth of the side walls 43 and 45, is deep to accommodate the material 29, flowing into it as long as that material 29, does not start contacting the adjacent lines 11, 21 or 31, and creating a short.

Figure 3D:
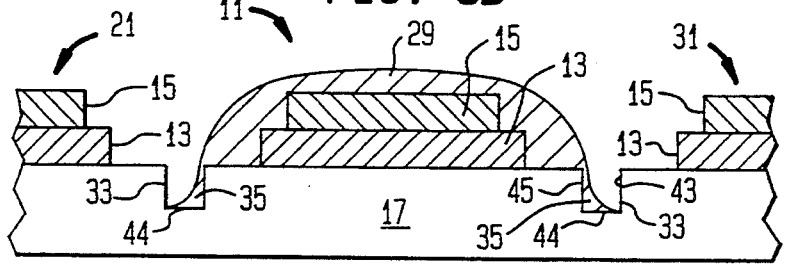

Subsequently, metal 29, such as gold, is deposited using the standard prior art method, such as, CVD deposition or laser ablation, to name a few, which results in the gold or metal 29, being deposited in the open between the electrical line 11 and 21 and/or 11 and 31, and the excess deposited material 35, such as gold, flows into the trench 33, as more clearly shown in FIG. 3D, which is a cross-sectional view taken along line 3D—3D, in FIG. 3C. The trench 33, of course has to be deep enough to capture all the excess material 35, as discussed earlier, so as not to create the prior art problem of the metal or gold forming a bridge between the two adjacent electrical lines 11 and 21 and/or 11 and 31. The inventive structure illustrated in FIG. 3D, does not exhibit the problems associated with the prior art method.

It was found that deeper grooves or trenches 33, in the substrate 17, lead to better results. There may be product or other physical limitations that may exist, however, which may prevent the use of deep grooves 33, such as thin dielectric material in a multilayer thin film structure or underlying wiring or features being too close to the surface that is being used to form these trenches or grooves 33. In these cases, a series of two or more shallow grooves 33, in parallel between the electrical lines 11, 21 or 31, would also produce the desired effects. A series of parallel grooves 33, also increases the effective length of heat transfer between adjacent features, such as the electrical lines 11, 21 or 31, and further acts to increase heat dissipation.

Figure 4:
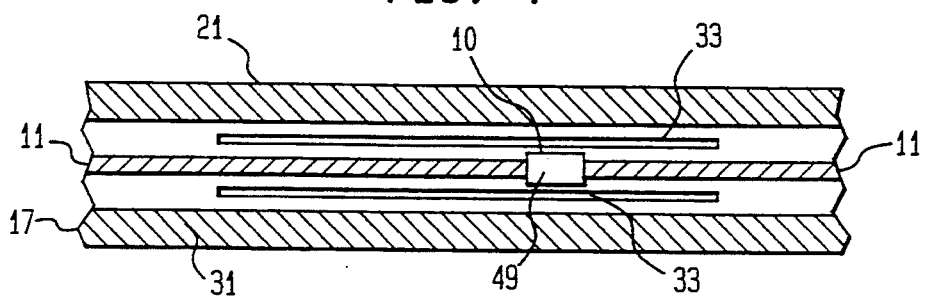
FIG. 4, illustrates a process and structure of another embodiment of repairing the open of FIG. 3A.

FIG. 4, illustrates a process and structure of another embodiment of repairing the open of FIG. 3A. A slug or nugget 49, is physically placed in the open 10, after the area in and around the open 10, has already been site-dressed. The slug or nugget 49, is then made to reflow, by methods well known in the art, such as, using a laser or hot gas reflow method, to name a few, so that the slug or nugget 49, physically makes an electrical connection between the two ends of the electrical line 11, and restores electrical connection to the line 11. The excess material of the slug or nugget is allowed to flow into the adjacent trenches 33. The slug or nugget 49, could be a solder or solder-type material, or an electrically conductive material that can be reflowed without damaging or harming the electrical lines 11, 21 or 31, or any of the features on the substrate 17. Of course the slug or nugget 49, could be an electrically conductive material that has a coating of a material that can be reflowed, such as, for example, a solder or a solder-type material. The slug or nugget 49, could be secured to the line 11, by methods well known in the art, such as the method could be selected from a group comprising ultrasonic bonding, brazing, thermal compression bonding, or lasersonic bonding.

Furthermore, at least a portion of the deposited electrically conductive material 29 or 49, could be covered with at least one low temperature electrically conductive material, and wherein the low temperature electrically conductive material could be secured to the deposited electrically conductive material by a method selected from hot gas reflow, furnace reflow, thermode, or laser reflow.

Moreover, at least a portion of the deposited electrically conductive material could be covered with solder, and wherein the solder could be secured to the electrical line by a method selected from hot gas reflow, furnace reflow, thermode, or laser reflow.

The metallurgical bond that is formed between the deposited electrically conductive material and the electrical line could be by melting of the solder. The electrically conductive material could also be an electrically conductive organometallic material or an electrically conductive polymeric material. The deposited electrically conductive material 29 or 49, could also have a coating of a low temperature electrically conductive material.

After the open has been repaired the further processing of the carrier or substrate could continue normally. For, example, at least a portion of the deposited electrically conductive material could be covered with at least one insulator material, wherein the insulator material could be polymer. Of course for any subsequent processing it would be advantageous to at least planarize the repaired area so that subsequent levels do not pose any manufacturing or reliability problems.

It would be preferred that the area of the site dressed location is at least 25 percent larger than the average cross-sectional dimensions of the electrical line.

The following example is intended to further illustrate the invention and is not intended to limit the scope of the invention in any manner.

EXAMPLE

Experimentation was performed on two layers of thin film metallurgy that had been deposited on a polyimide carrier. The electrical lines that were formed were about 30 to about 40 microns in width and approximately 6 microns in height. Opens were created in the thin film lines using an excimer laser and various configurations of grooves or trenches around these simulated open defects were performed. The grooves or trenches that were made ranged from about 5 microns to about 15 microns in width and from about 2 to about 10 microns in depth. Experiments indicated that deeper grooves or trenches in the surrounding material lead to better results. There may be product or other physical limitations that may exist, however, which may prevent the use of deep grooves, such as thin dielectric material in a multilayer thin film structure or underlying wiring lines being too close to the surface that is being used to form these trenches or grooves. In these cases, a series of two or more shallow grooves in parallel would also produce the desired effects. A series of parallel grooves increases the effective length of heat transfer between adjacent features and acts as a heat dissipation mechanism.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method for repairing electrical lines on a substrate comprising the following steps:
    a. locating said electrical line that needs to be repaired, and site dressing said location,
    b. forming at least one trench on said substrate adjacent to said site dressed location such that at least a portion of said at least one trench is close to at least a portion of said site dressed location and said electrical line,
    c. depositing electrically conductive material in said site dressed location to restore electrical continuity to said electrical line while allowing an excess portion of said deposited material to flow into at least a portion of said at least one trench.

2. The method of claim 1, further comprising at least two trenches.

3. The method of claim 2, wherein at least one trench is on one side of said site dressed location while at least a second trench is on the opposite side of said site dressed location.

4. The method of claim 1, wherein said electrically conductive material is deposited using a process selected from a group consisting of CVD deposition or laser ablation.

5. The method of claim 1, wherein said electrically conductive material is selected from a group comprising aluminum, antimony, bismuth, chromium, cobalt, copper, gold, indium, iron, lead, molybdenum, nickel, palladium, platinum, silver, tantalum, tin, titanium, tungsten, or alloys thereof.

6. The method of claim 1, wherein the upper surface of said electrical line to be repaired is laser ablated.

7. The method of claim 1, wherein the area of said site dressed location is at least 25 percent larger than the average cross-sectional dimensions of said electrical line.

8. The method of claim 1, wherein said electrical line is in a thin film packaging structure.

9. The method of claim 1, wherein at least a portion of said deposited electrically conductive material is covered with at least one insulator material.

10. The method of claim 1, wherein at least a portion of said deposited electrically conductive material is covered with at least one polymer material.

11. The method of claim 1, wherein said deposited electrically conductive material is a nugget, and wherein said nugget is secured to said line, by a method selected from a group comprising ultrasonic bonding, brazing, thermal compression bonding, or lasersonic bonding.

12. The method of claim 1, wherein at least a portion of said deposited electrically conductive material is covered with at least one low temperature electrically conductive material, and wherein said low temperature electrically conductive material is secured to said deposited electrically conductive material by a method selected from hot gas reflow, furnace reflow, thermode, or laser reflow.

13. The method of claim 1, wherein at least a portion of said deposited electrically conductive material is covered with solder, and wherein said solder is secured to said electrical line by a method selected from hot gas reflow, furnace reflow, thermode, or laser reflow.

14. The method of claim 13, wherein a metallurgical bond is formed between said deposited electrically conductive material and said electrical line by melting of said solder.

15. The method of claim 1, wherein said electrically conductive material is an electrically conductive organometallic material.

16. The method of claim 1, wherein said electrically conductive material is an electrically conductive polymeric material.

17. The method of claim 1, wherein at least a portion of said deposited electrically conductive material has a coating of a low temperature electrically conductive material.

18. The method of claim 1, wherein said defective electrical line is a thin-film line.

19. The method of claim 1, wherein at least a portion of said at least one trench is substantially parallel to at least a portion of said site dressed location.

* * * * *